United States Patent
Sasaki et al.

(10) Patent No.: US 9,269,619 B2
(45) Date of Patent: Feb. 23, 2016

(54) SEMICONDUCTOR DEVICE AND METHOD FOR MANUFACTURING THE SAME

(71) Applicant: Kabushiki Kaisha Toshiba, Minato-ku (JP)

(72) Inventors: Fumio Sasaki, Kanagawa-ken (JP); Hisao Kawasaki, Kanagawa-ken (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/822,224

(22) Filed: Aug. 10, 2015

(65) Prior Publication Data

US 2015/0348841 A1    Dec. 3, 2015

Related U.S. Application Data

(62) Division of application No. 14/021,002, filed on Sep. 9, 2013.

(30) Foreign Application Priority Data

Feb. 21, 2013 (JP) .................................. 2013-032528
May 23, 2013 (JP) .................................. 2013-109204

(51) Int. Cl.
*H01L 21/768* (2006.01)
*H01L 23/532* (2006.01)
*H01L 21/324* (2006.01)

(52) U.S. Cl.
CPC ........ *H01L 21/76879* (2013.01); *H01L 21/324* (2013.01); *H01L 21/76871* (2013.01); *H01L 21/76898* (2013.01); *H01L 23/53257* (2013.01)

(58) Field of Classification Search
CPC ............. H01L 23/532; H01L 21/768; H01L 21/76879; H01L 23/53257; H01L 31/04; H01L 21/3205; H01L 23/52; H01L 21/44; H01L 21/302; H01L 21/3065; H01L 29/41
USPC .......... 438/660, 652, 39, 113, 458, 462, 675, 438/629, 637, 639, 640, 667, 668, 672
See application file for complete search history.

(56) References Cited

U.S. PATENT DOCUMENTS 6,384,317 B1 *    5/2002    Kerschaver et al. .......... 136/256
8,987,042 B2 *    3/2015    Varghese et al. ................ 438/98

(Continued)

FOREIGN PATENT DOCUMENTS

JP    2012-33576        2/2012
JP    2012-33576 A      2/2012

(Continued)

OTHER PUBLICATIONS

Office Action issued Nov. 14, 2014 in Korean Patent Application No. 10-2013-0107658 (w/English language translation).

(Continued)

*Primary Examiner* — Chuong A Luu
(74) *Attorney, Agent, or Firm* — Oblon, McClelland, Maier & Neustadt, L.L.P.

(57) ABSTRACT

A semiconductor device concerning the embodiment includes a semiconductor layer which has a first surface and a second surface which is opposite to the first surface, an interlayer which is provided on the first surface and which consists of only metal whose standard oxidation-reduction potential is not lower than 0 (zero) V in an ionization tendency, and an electrode provided on the interlayer. The semiconductor device further includes an electrical conductive layer which covers an inside of a hole which is formed in the semiconductor layer so as to reach the interlayer the interlayer from the second surface, and which is electrically connected to the electrode via the interlayer which is exposed to a bottom of the hole.

2 Claims, 5 Drawing Sheets

(56) References Cited

U.S. PATENT DOCUMENTS

| | | |
|---|---|---|
| 2008/0073752 A1 | 3/2008 | Asai et al. |
| 2011/0139241 A1* | 6/2011 | Clement et al. ............... 136/256 |
| 2012/0006393 A1* | 1/2012 | Cruz et al. ................... 136/256 |
| 2012/0104563 A1 | 5/2012 | Saito et al. |
| 2012/0138128 A1 | 6/2012 | Wu et al. |
| 2012/0270359 A1* | 10/2012 | Kumar et al. ................... 438/71 |

FOREIGN PATENT DOCUMENTS

| | | |
|---|---|---|
| JP | 2012-59887 A | 3/2012 |
| KR | 10-2008-0028769 A | 4/2008 |

OTHER PUBLICATIONS

Office Action issued May 22, 2015 in Taiwanese Patent Application No. 102132194 (with English language translation).

* cited by examiner

COMPARATIVE EXAMPLE

COMPARATIVE EXAMPLE

SEMICONDUCTOR DEVICE AND METHOD FOR MANUFACTURING THE SAME

CROSS-REFERENCE TO RELATED APPLICATION(S)

This application is a division of and claims priority under 35 U.S.C. §120 from U.S. Ser. No. 14/021,002 filed Sep. 9, 2013, and claims the benefit of priority under 35 U.S.C. §119 from Japanese Patent Application No. 2013-032528 filed Feb. 21, 2013 and Japanese Patent Application No. 2013-109204 filed May 23, 2013, the entire contents of each of which are incorporated herein by reference.

FIELD

An embodiment relates to a semiconductor device and a method for manufacturing the same.

BACKGROUND

As for a lateral semiconductor device in which current flows in the parallel direction to a surface of a semiconductor layer, an electrode provided on a surface of the semiconductor layer and a back electrode provided on a back surface of the semiconductor layer are electrically connected using a via hole. Thereby, a surface side electrode is grounded and operation of the semiconductor device is stabilized. Since a metal layer which is simultaneously formed with an ohmic electrode is generally used as the surface side electrode, the surface side electrode consists of an alloy layer containing gold germanium (AuGe), nickel (Ni) and gold (Au), and a reaction layer which is formed by reaction of the alloy layer and the semiconductor layer. A hole of the via hole is formed by etching the semiconductor layer selectively using an RIE (Reactive Ion Etching) method, for example. Etching gas contains chlorine, for example.

The surface side electrode may deform with the heat at the time of mounting the semiconductor device on a package or a mounting board, and thereby a contact between the surface side electrode and the back electrode may become unstable.

The embodiment supplies a reliable semiconductor device in which a connection between a surface side electrode and a back electrode through a via hole is stable.

DETAILED DESCRIPTION

Figure 1A:
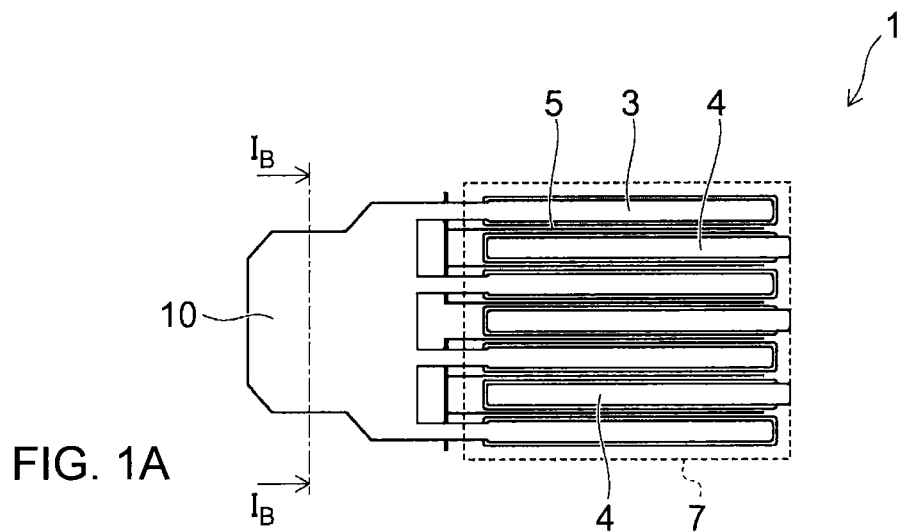
FIGS. 1A and 1B are schematic diagrams showing a semiconductor device concerning an embodiment.

According to an embodiment, a semiconductor device includes a semiconductor layer, an interlayer, an electrode provided on the interlayer, and an electrical conductive layer which is electrically connected to the electrode. The semiconductor layer has a first surface and a second surface which is opposite to the first surface. The interlayer is provided on the first surface, and includes a metal layer consisting of only metal whose standard oxidation-reduction potential is not lower than 0 (zero) V in an ionization tendency. The electrical conductive layer covers an inside of a hole which is formed in the semiconductor layer so as to reach the interlayer from the second surface, and is electrically connected to the electrode via the interlayer which is exposed to a bottom of the hole.

Hereinafter, an embodiment will be explained referring to drawings. The same numerals are given to the same portions in the drawings, and overlapping explanations are omitted.

Figure 1B:
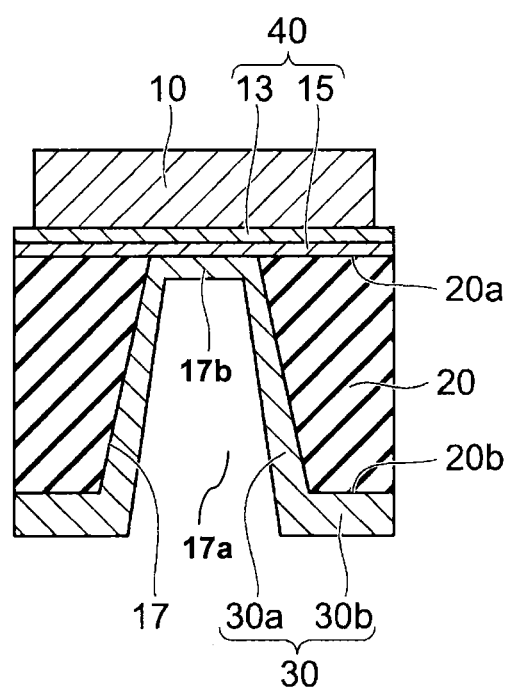

FIG. 1A and FIG. 1B are schematic diagrams showing a semiconductor device 1 concerning the embodiment. FIG. 1A is a top view showing a part of the semiconductor device. FIG. 1B is a sectional view taken along line 1B-1B shown in FIG. 1A.

The semiconductor device 1 is a field effect transistor, for example, and is provided with a functional part 7 and a pad electrode 10. The functional part 7 contains source electrodes 3, drain electrodes 4, and gate electrodes 5. As shown in FIG. 1A, the pad electrode 10 is connected to a plurality of the source electrodes 3.

In addition, as shown in FIG. 1B, the semiconductor device 1 is provided with a semiconductor layer 20, an electrical conductive layer 30, and an interlayer 40. The semiconductor layer 20 has a first surface 20a, and a second surface 20b that is opposite to the first surface 20a. The interlayer 40 is formed in contact with the first side 20a of the semiconductor layer 20. The pad electrode 10 is formed on the interlayer 40. Another layer which has conductivity may be provided between the pad electrode 10 and the interlayer 40.

The semiconductor layer 20 has a via hole 17. The via hole 17 includes a hole 17a which penetrates the semiconductor layer 20 in the direction facing to the pad electrode 10 from the second surface 20b and reaches the interlayer 40 from the second surface 20b, and a via contact 30a which covers an inside of the hole 17a. The electrical conductive layer 30 contains the via contact 30a and a back electrode 30b provided on the second surface 20a.

The via contact 30a is in contact with the interlayer 40 which is exposed to a bottom 17b of the hole 17a. The interlayer 40 is an electrical conductive layer containing platinum (Pt), for example, and the electrical conductive layer 30 is electrically connected to the pad electrode 10 via the interlayer 40.

For example, the interlayer 40 contains a metal layer 13 and a reaction layer 15 which is formed by reaction of the metal layer 13 and the semiconductor layer 20. The electrical conductive layer 30 is in contact with the reaction layer 15. Also, the reaction layer 15 may be removed at the bottom 17b of the hole 17 and the electrical conductive layer 30 may be contact with the metal layer 13 directly. Here, the metal layer 13 consists of only metal whose standard oxidation-reduction potential is not lower than 0 (zero) V in an ionization tendency, for example.

And the interlayer 40 is apart from the functional part 7 which is electrically connected to the pad electrode 10. That is, the interlayer 40 should just be under the pad electrode 10, and does not need to be provide under the functional part 7 and a part which connects the functional part 7 and the pad electrode 10.

Figure 2:
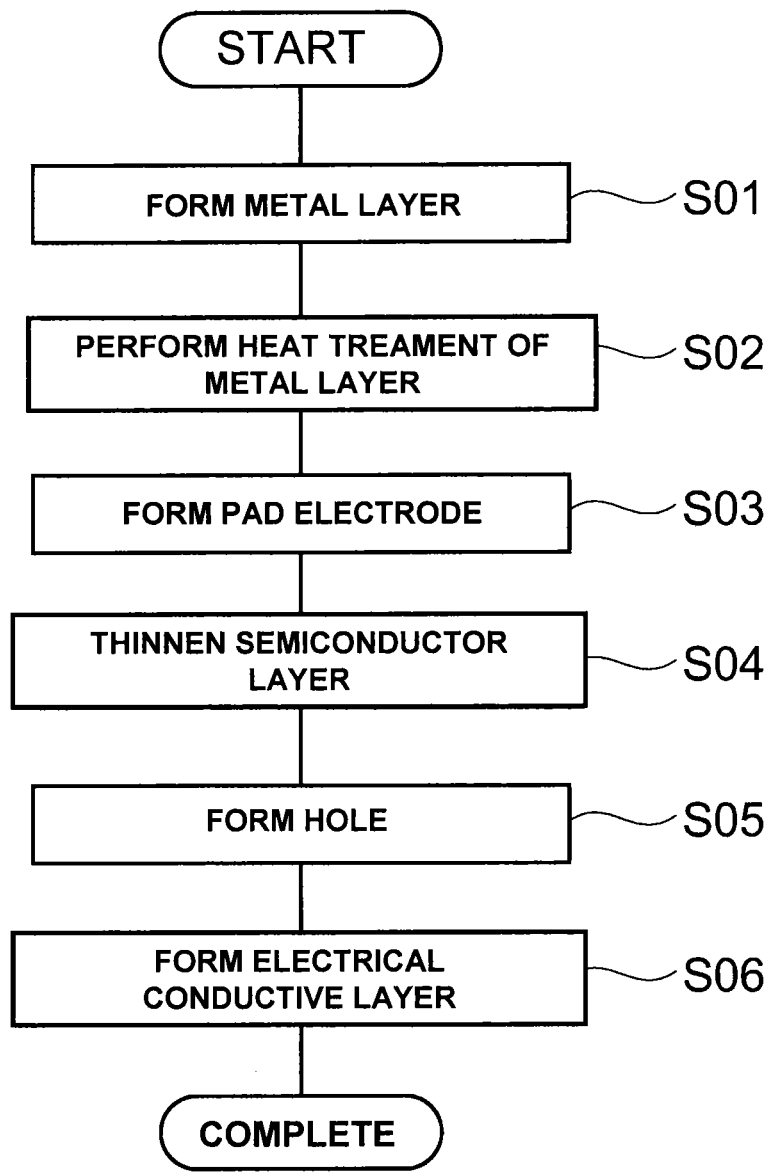
FIG. 2 is a flow chart showing a manufacture process of the semiconductor device concerning the embodiment.

Next, a manufacturing method of the semiconductor device 1 is explained with reference to FIG. 2 and FIGS. 3A-3F. FIG. 2 is a flow chart showing the manufacture process of the semiconductor device 1 concerning the embodiment. FIGS. 3A-3F are schematic sectional views showing the manufacture process of the semiconductor device concerning the embodiment. In addition, FIGS. 3A-3F correspond to steps 01-06 shown in FIG. 2 and show partial cross section of a wafer in each step.

Figure 3A:
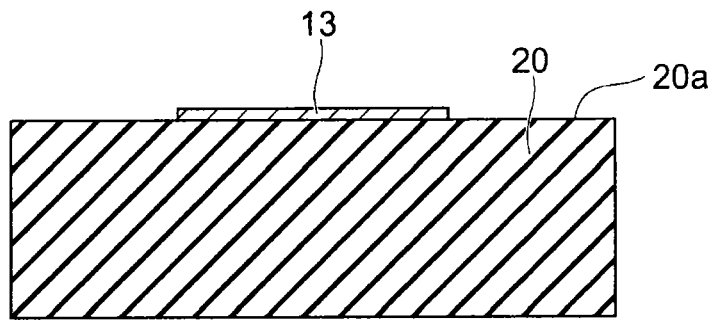
FIGS. 3A-3F are schematic sectional views showing the manufacture process of the semiconductor device concerning the embodiment.

To begin with, the metal layer 13 is formed on the first surface 20a of the semiconductor layer 20 as shown in FIG. 3A (S01).

The semiconductor layer 20 is a high resistance layer of semi-insulation, and gallium arsenide (GaAs), indium phosphate (InP), or gallium nitride (GaN) can be used as the semiconductor layer 20, for example. Also, a GaAs board or InP board of semi-insulation may be sufficient as the semiconductor layer 20.

The metal layer 13 is selectively formed on a part of the semiconductor layer 20 on which the pad electrode 10 is formed. The metal layer 13 is desirable to have tolerance for the dry etching which is used for formation of the hole 17a for the via hole 17. That is, a metal which is chemically stable and does not react to the active element contained in an etching gas is used as the metal layer 13. The etching gas contains chlorine when the semiconductor layer 20 is a GaAs layer or an InP layer, for example. Therefore, it is preferable to use platinum (Pt) which is stable chemically to chlorine as the metal layer 13.

On the other hand, the specific resistance of platinum is larger than the specific resistance of gold (Au) which is used for the pad electrode 10. For this reason, as for the thickness of the metal layer 13, it is desirable that it is not larger than 60 nm, for example.

Figure 3B:
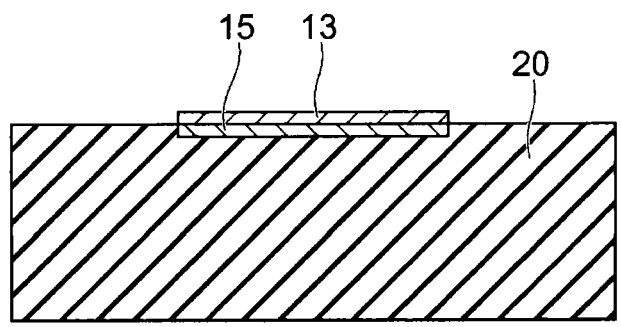

Next, as shown in FIG. 3B, by adding heat treatment to the semiconductor layer 20 and the metal layer 13, the semiconductor layer 20 and the metal layer 13 react to thereby form the reaction layer 15 (S02).

When the metal layer 13 is a platinum layer, the reaction layer 15 containing platinum is formed between the semiconductor layer 20 and the metal layer 13.

Figure 3C:
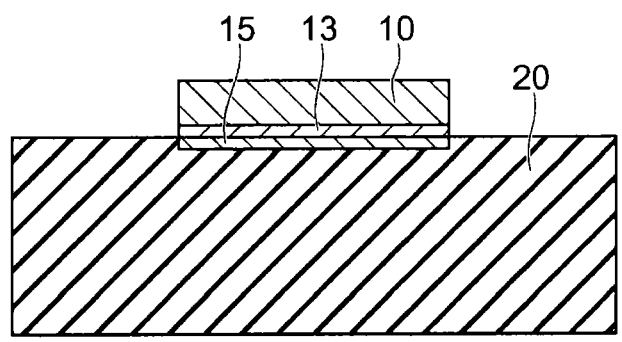

Next, as shown in FIG. 3C, the pad electrode 10 is formed on the metal layer 13 (S03). The pad electrode 10 is a source pad, for example, and is formed so as to be connected to the source electrodes 3. An Au layer can be used as the pad electrode 10, for example.

Figure 3D:
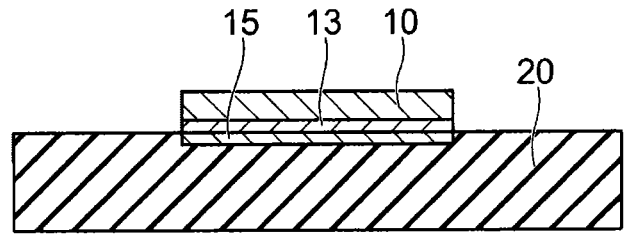

Next, as shown in FIG. 3D, the semiconductor layer 20 is thinned (S04). When a GaAs board or an InP board is used as the semiconductor layer 20, for example, the semiconductor layer 20 is thinned to thickness of several 10 μm by grinding or polishing. In addition, an epitaxially grown layer separated from a growth board may be used as the semiconductor layer 20.

Figure 3E:
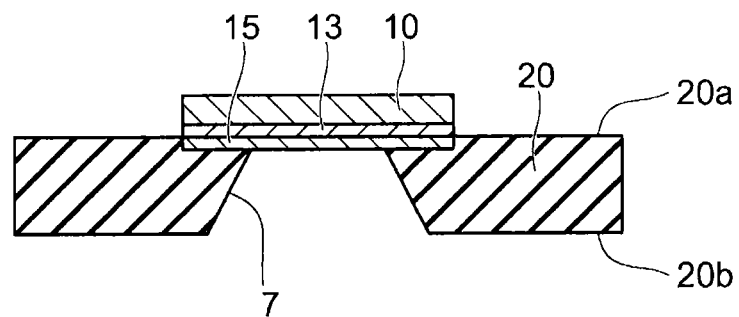

Next, as shown in FIG. 3E, the hole 17a is formed in the direction which faces to the pad electrode 10 from the second surface 20b of the semiconductor layer 20 which has been thinned (S05). The semiconductor layer 20 is selectively etched using the RIE (Reactive Ion Etching) method, for example, to thereby form the hole 17a. An etching gas contains chlorine, for example.

The hole 17a reaches either of the reaction layer 15 and the metal layers 13. For example, when a platinum layer is used for the metal layer 13, the reaction layer 15 contains platinum. The etching rate of the reaction layer 15 becomes lower than the etching rate of the semiconductor layer 20. Thereby, it becomes easy to stop etching at the reaction layer 15. That is, the reaction layer 15 can be exposed to the second surface side of the semiconductor layer 20. Also, the reaction layer 15 may be removed to thereby expose the metal layer 13.

Figure 3F:
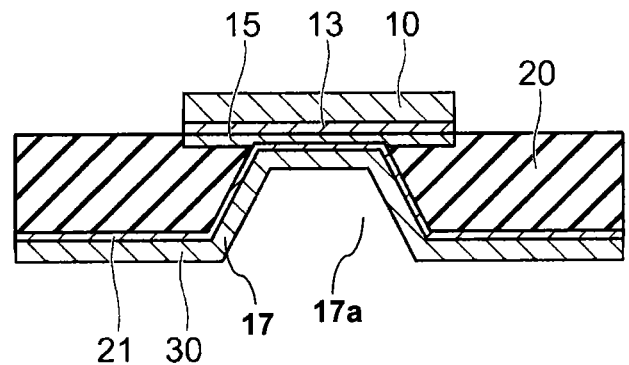

Next, as shown in FIG. 3F, the electrical conductive layer 30 which covers the inside of the hole 17a is formed and thereby the via hole 17 is formed (S06). The electrical conductive layer 30 is a gold plate layer, for example. A seed layer 21 is formed on the inside of the hole 17a and the second surface 20b, for example. Then, electrolytic plating of gold is performed while flowing current through the seed layer 21 and a gold plate layer is formed on the seed layer 21. A two-layer film in which titanium (Ti) and gold (Au) are laminated in order from the semiconductor layer 20 side can be used as the seed layer 21, for example. Ti film raises the adhesion power between the semiconductor layer 20 and the electrical conductive layer 30, and raises the adhesion power between the reaction layer 15 and the electrical conductive layer 30.

The above-mentioned manufacture process can form a via-structure which electrically connects the pad electrode 10 provided on first surface 20a of the semiconductor layer 20 and the electrical conductive layer 30 provided in the second surface 20b side.

Figure 4A:
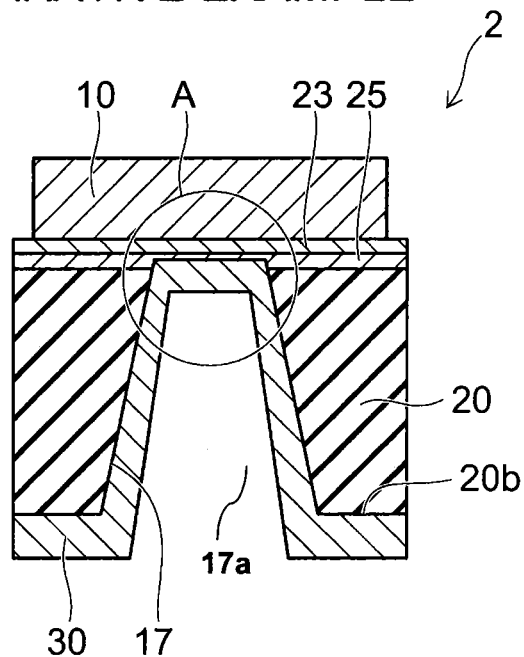
FIGS. 4A and 4B are schematic sectional views showing a semiconductor device concerning a comparative example.
Figure 4B:
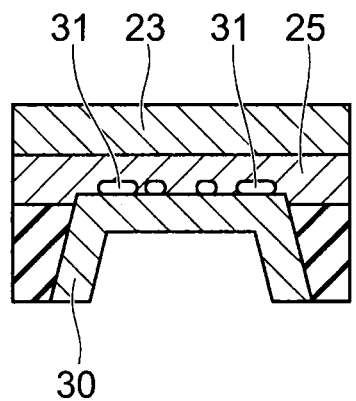

FIGS. 4A and 4B are schematic sectional views showing a semiconductor device 2 concerning a comparative example. FIG. 4A shows a cross section (refer to FIG. 1B) taken along an $I_B$-$I_B$ line. FIG. 4B is an enlarged drawing of a part A shown in FIG. 4A, and shows a connection structure between the pad electrode 10 and the electrical conductive layer 30.

The semiconductor device 2 includes a metal layer 23 and a reaction layer 25. The metal layer 23 contains a metal whose standard oxidation-reduction potential is lower than 0 (zero) V in an ionization tendency, for example. Accordingly, the reaction layer 25 contains a metal whose standard oxidation-reduction potential is lower than 0 (zero) V in an ionization tendency, for example.

The metal layer 23 contains gold germanium (AuGe), nickel (nickel) and gold (Au) which were laminated in order from the semiconductor layer 20 side, for example, because the semiconductor device 2 uses a metal layer which is simultaneously formed with the ohmic electrode as a surface side electrode. That is, the metal layer 23 contains nickel which reacts chemically with chlorine. And the reaction layer 25 which is formed by heat-treating the metal layer 23 and the semiconductor layer 20 also contains nickel.

Also in this comparative example, the semiconductor layer 20 is etched in the direction which faces to the pad electrode 10 from the second surface 20b of the semiconductor layer 20 by dry etching and thereby the hole 17a is formed. And the reaction layer 25 is exposed to the second surface 20b side. At this time, nickel contained in the reaction layer 25 reacts with chlorine contained in an etching gas, and thereby chlorination nickel (NiCl2) is produced on an exposed surface of the reaction layer 25.

Chlorination nickel corrodes the reaction layer 25 in the formation process of the electrical conductive layer 30, and forms voids 31 in the surface of the reaction layer 25 as shown in FIG. 4B. And plating liquid enters into the voids 31 in the process of gold-plating which forms an electrical conductive layer 30, and the plating liquid may remain in the void 31 as it is.

When the semiconductor device 2 is heated in a case that the semiconductor device 2 is mounted on a package or a mounting board, the plating liquid which remains inside the void 31 evaporate to thereby raise the internal pressure of the void 31. For this reason, the phenomenon in which the reaction layer 25 is dissociated from the electrical conductive layer 30, and in which the reaction layer 25, the metal layer 23 and pad electrode 10 are inflated occurs. As a result, an electrical connection between the electrical conductive layer 30 and the pad electrode 10 may be lost, and operation of the semiconductor device 2 may become unstable.

On the other hand, according to the embodiment, the metal layer 13 is chemically stable to chlorine contained in the etching gas. That is, the metal layer 13 does not contain any element that reacts with the active element contained in the etching gas. Even if the metal layer 13 contains such an element that reacts with the active element contained in the etching gas, the concentration of such element is not higher than a level detectable using the measuring means, such as an SIMS (Secondary Ion Mass Spectrometry) and a Auger spectroscopy.

Also the reaction layer 15 that is formed by reaction of the metal layer 13 and the semiconductor layer 20 does not contain any unstable element to chlorine contained in the etching gas. For this reason, the void 31 is not formed between the reaction layer 15 and the electrical conductive layer 30, and deformation of the reaction layer 15, the metal layer 13 and the pad electrode 10 can be suppressed. And the electrical connection between the electrical conductive layer 30 and the pad electrode 10 is held stable, and the reliability of the semiconductor device can be improved.

A metal which is chemically unstable to chlorine contained in the etching gas is metal whose standard oxidation-reduction potential is lower than 0 (zero) V in an ionization tendency. Aluminum (Al), titanium (Ti), tantalum (Ta), chromium (Cr), nickel (nickel), tin (Sn), etc. out of the metals used in a semiconductor process in many cases, correspond to such a metal.

A metal which is chemically stable to chlorine contained in the etching gas is a metal whose standard oxidation-reduction potential is not lower than 0 (zero) V in an ionization tendency. Copper (Cu), palladium (Pd), platinum (Pt), gold (Au), etc. out of the metals used in a semiconductor process in many cases, correspond to such a metal.

While the embodiment has been described, the embodiment has been presented by way of example only, and is not intended to limit the scope of the inventions. Indeed, the novel embodiment described herein may be embodied in a variety of other forms; furthermore, various omissions, substitutions and changes in the form of the embodiment described herein may be made without departing from the spirit of the inventions. The accompanying claims and their equivalents are intended to cover such forms or modifications as would fall within the scope and spirit of the inventions.

What is claimed is:

1. A method for manufacturing a semiconductor device, comprising:
    forming a metal layer consisting of only metal whose standard oxidation-reduction potential is not lower than 0 (zero) V in an ionization tendency on a first surface of a semiconductor layer;
    forming a reaction layer by heat-treating the metal layer and the semiconductor layer;
    forming an electrode on the metal layer;
    exposing at least one of the reaction layer and the metal layer to the second surface of the semiconductor layer which is opposite to the first surface by forming a hole which penetrates the semiconductor layer in the direction facing to the electrode from the second surface by dry etching using an etching gas containing chlorine; and
    forming an electrical conductive layer which covers the inside of the hole and is electrically connected to the electrode.

2. The method for making semiconductor device according to claim 1, wherein the metal layer is a platinum layer.

* * * * *